(12) United States Patent
Dyer et al.

(10) Patent No.: US 7,582,516 B2
(45) Date of Patent: Sep. 1, 2009

(54) CMOS DEVICES WITH HYBRID CHANNEL ORIENTATIONS, AND METHODS FOR FABRICATING THE SAME USING FACETED EPITAXY

(75) Inventors: Thomas W. Dyer, Pleasant Valley, NY (US); Sunfei Fang, LaGrangeville, NY (US); Judson R. Holt, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 330 days.

(21) Appl. No.: 11/422,443

(22) Filed: Jun. 6, 2006

(65) Prior Publication Data

US 2007/0278585 A1 Dec. 6, 2007

(51) Int. Cl.
*H01L 21/00* (2006.01)
*H01L 21/76* (2006.01)
(52) U.S. Cl. .................. 438/154; 438/164; 438/412; 257/351; 257/627; 257/628; 257/E27.064
(58) Field of Classification Search ............... 257/255, 257/351, 353, 527, 627, 628; 438/154, 164, 438/412
See application file for complete search history.

(56) References Cited

U.S. PATENT DOCUMENTS

| 5,273,621 | A | 12/1993 | Feygenson et al. |
| 5,733,792 | A | 3/1998 | Masuoka |
| 6,858,490 | B2 | 2/2005 | Kim |
| 6,864,520 | B2 * | 3/2005 | Fischetti et al. .............. 257/255 |
| 2003/0190791 | A1 | 10/2003 | Fischetti et al. |
| 2005/0275018 | A1 | 12/2005 | Venkatesan et al. |
| 2006/0040437 | A1 * | 2/2006 | Sandhu et al. .............. 438/186 |

(Continued)

FOREIGN PATENT DOCUMENTS

| CN | 1604232 | 4/2005 |
| CN | 1645629 | 7/2005 |

OTHER PUBLICATIONS

Spallek, Rainer G. et al., "Modelling and Simulating the Selective Epitaxial Growth Silicon under Consideration of Anisotropic Growth Rates."

(Continued)

*Primary Examiner*—Hsien-ming Lee
(74) *Attorney, Agent, or Firm*—Scully, Scott, Murphy & Presser, P.C.; H. Daniel Schnurmann (57) ABSTRACT

The present invention relates to a semiconductor substrate comprising at least first and second device regions. The first device region has a substantially planar surface oriented along one of a first set of equivalent crystal planes, and the second device region contains a protruding semiconductor structure having multiple intercepting surfaces oriented along a second, different set of equivalent crystal planes. A semiconductor device structure can be formed using such a semiconductor substrate. Specifically, a first field effect transistor (FET) can be formed at the first device region, which comprises a channel that extends along the substantially planar surface of the first device region. A second, complementary FET can be formed at the second device region, while the second, complementary FET comprises a channel that extends along the multiple intercepting surfaces of the protruding semiconductor structure at the second device region.

18 Claims, 9 Drawing Sheets

U.S. PATENT DOCUMENTS

2006/0148154 A1* 7/2006 Shin et al. .................. 438/198
2007/0254412 A1* 11/2007 Dyer et al. ................. 438/142

OTHER PUBLICATIONS

Vescan, L. et al., "Facet Investigation in Selective Epitaxial Growth of Si and SiGe on (001) Si for Optoelectronic Devices." J. Vac. Sci. Technol. B 16(3), May/Jun. 1998 p. 1549-1554.

Loo, R. et al. "A Successful Selective Epitaxial Si1-xGex Deposition Process for HBT-BiCMOS and High-Mobility Heterojunction pMOS Applications." Yld. Mang. Sol. (2004).

Spallek, Rainer G. et al., "Modelling and Simulating the Selective Epitaxial Growth Silicon under Consideration of Anisotropic Growth Rates," (European Solid-State Device Research, Sep. 2003).

* cited by examiner

CMOS DEVICES WITH HYBRID CHANNEL ORIENTATIONS, AND METHODS FOR FABRICATING THE SAME USING FACETED EPITAXY

FIELD OF THE INVENTION

The present invention relates to semiconductor devices that can be used in complementary metal-oxide-semiconductor (CMOS) circuits. More specifically, the present invention relates to a CMOS circuit that comprises at least one n-channel field effect transistor (n-FET) and at least one p-channel field effect transistor (p-FET) with hybrid channel orientations. In other words, the n-FET and p-FET of the CMOS circuit comprise channels that are oriented along different sets of crystal planes of the semiconductor substrate on which the CMOS circuit is located.

BACKGROUND OF THE INVENTION

In present semiconductor technology, CMOS devices such as n-FETs and p-FETs are typically fabricated upon semiconductor wafers that each has a substrate surface oriented along one of a single set of equivalent crystal planes of the semiconductor material (e.g., Si) that forms the substrate. In particular, most of today's semiconductor devices are built upon silicon wafers having wafer surfaces oriented along one of the {100} crystal planes of silicon.

Electrons are known to have a high mobility along the {100} crystal planes of silicon, but holes are known to have high mobility along the {110} crystal planes of silicon. On one hand, hole mobility values along the {100} planes are roughly about 2 to 4 times lower than the corresponding electron mobility values along such planes. On the other hand, hole mobility values along the {110} silicon surfaces are about 2 times higher than those along the {100} silicon surfaces, but electron mobility along the {110} surfaces are significantly degraded compared to those along the {100} surfaces.

As can be deduced from the above, the {110} silicon surfaces are optimal for forming p-FET devices due to the excellent hole mobility along the {110} planes, which leads to higher drive currents in the p-FETs. However, such surfaces are completely inappropriate for forming n-FET devices. The {100} silicon surfaces instead are optimal for forming n-FET devices due to the enhanced electron mobility along the {100} planes, which results in higher drive currents in the n-FETs.

Figure 1:
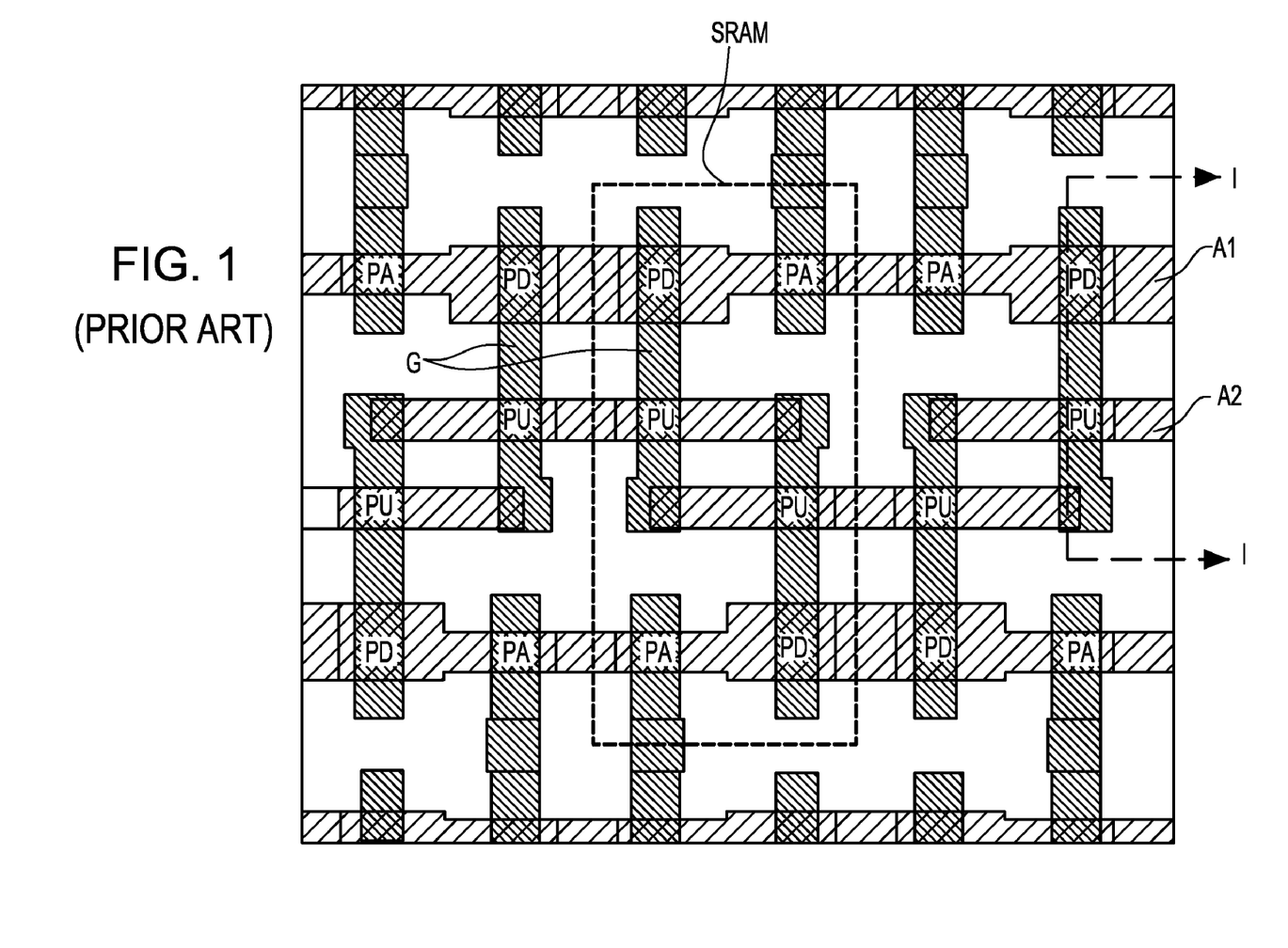
FIG. 1 shows a SRAM cell containing adjacent n-FET and p-FET active regions.

In typical CMOS circuits, complementary n-FETs and p-FETs are provided side-by-side. For example, FIG. 1 shows CMOS static random access memory (SRAM) cells, each of which comprises two n-FETs that function as pass-gate transistors (PA), two n-FETs that function as pull-down transistors (PD), and two p-FETs that function as pull-up transistors (PU). Since the pass-gate transistors (PA) and the pull-down transistors (PD) are both n-FETs, they are formed within the same active region (A1). The pull-up transistors (PU), which are p-FETs, are formed in a different active region (A2) that is isolated from A1 by trench isolation regions. Gate structures (G) are arranged above various active regions to form gates for the FETs, where channel regions of the FETs are located directly under the gate structures (G) in the active regions.

The n-FET active region A1 and the p-FET active region A2 are located side-by-side in the substrate along line I-I, as shown in FIG. 1. On one hand, if the substrate surface is oriented along one of the {110} planes of silicon, the device performance of the pull-up transistors (PU), which are p-FETs, are enhanced, but the device performance of the pass-gate transistors (PA) and pull-down transistors (PD), which are both n-FETs, are degraded. On the other hand, if the substrate surface is oriented along one of the {100} planes of silicon, the device performance of the pass-gate transistors (PA) and pull-down transistors (PD) are enhanced, but the device performance of the pull-up transistors (PU) are degraded.

There is therefore a need for providing a semiconductor substrate having different surface orientations (i.e., hybrid surface orientations) for enhancing the device performance of SRAM cells or like devices that comprise both n-FETs and p-FETs.

A need also exists to provide an integrated semiconductor device that is located on a substrate with hybrid surface orientations and comprises at least a first FET (i.e., either an n-FET or a p-FET) and a second, complementary FET (i.e., either a p-FET or an n-FET). The first and second, complementary FETs have hybrid channel orientations, i.e., the channel of the first FET is oriented along a first set of equivalent crystal planes that provide relatively higher carrier mobility in the first FET, and the channel of the second, complementary FET is oriented along a second, different set of equivalent crystal planes that provide relatively higher carrier mobility in the second, complementary FET.

SUMMARY OF THE INVENTION

The present invention provides a semiconductor substrate with hybrid surface orientations. The semiconductor substrate of the present invention may either comprise a bulk semiconductor structure or a layered semiconductor-on-insulator (SOI) structure with a substrate surface that is oriented along one of a first set of equivalent crystal planes. Faceted epitaxy is carried out at a selected region of the semiconductor substrate to form a protruding semiconductor structure with multiple intercepting surfaces that are oriented along a second, different set of equivalent crystal planes. Such a semiconductor substrate can be readily used to form SRAM cells or other CMOS devices that comprise complementary FETs with different channel orientations.

In one aspect, the present invention relates to a semiconductor device comprising:
- a semiconductor substrate comprising first and second device regions, wherein the first device region has a substantially planar surface oriented along one of a first set of equivalent crystal planes, and wherein the second device region comprises a protruding semiconductor structure having multiple intercepting surfaces oriented along a second, different set of equivalent crystal planes;
- a first field effect transistor (FET) located at the first device region, said first FET comprising a channel that extends along the substantially planar upper surface of the first device region; and
- a second, complementary FET located at the second device region, the second, complementary FET comprises a channel that extends along the multiple intercepting upper surfaces of the protruding semiconductor structure at the second device region.

The semiconductor substrate and the protruding semiconductor structure of the present invention may comprise any suitable semiconductor material. Preferably, the semiconductor substrate and the protruding semiconductor structure comprise semiconductor materials that are independently selected from the group consisting of Si, SiGe, graded SiGe, Ge, Ge alloys, Si:C, SiGe:C, GaAs, InAs, InP, and III-V or II-VI compound semiconductors.

Preferably, but not necessarily, the semiconductor substrate and the protruding semiconductor structure both comprise silicon, and the first and second sets of equivalent crystal planes are selected from the group consisting of the {100}, {110}, and {111} planes of silicon.

In a specific embodiment of the present invention, the first set of equivalent crystal planes are the {100} planes of silicon, and the second, different set of equivalent crystal planes are the {111} planes of silicon. Correspondingly, the first FET is preferably an n-channel FET, and the second, complementary FET is preferably a p-channel FET.

In an alternatively embodiment of the present invention, the first set of equivalent crystal planes are the {110} planes of silicon, and the second, different set of equivalent crystal planes are the {111} planes of silicon. Correspondingly, the first FET is preferably a p-channel FET, and the second, complementary FET is preferably an n-channel FET.

The semiconductor device as described hereinabove can be any CMOS device that comprises an n-channel FET and a p-channel FET. Preferably, the semiconductor device is a static random access memory (SRAM) cell that comprises at least one pull-down FET (i.e., an n-channel FET) located at one of the first and second device regions and at least one pull-up FET (i.e., a p-channel FET) located at the other of the first and second device regions.

The semiconductor substrate as described hereinabove may comprise a bulk semiconductor structure. Alternatively, it may have a semiconductor-on-insulator (SOI) configuration and comprises, from bottom to top, a base semiconductor substrate layer, a buried insulator layer, and a semiconductor device layer. Further, the semiconductor substrate may comprise one or more isolation regions that isolate the first and second device regions from each other.

In another aspect, the present invention relates to a method for forming a semiconductor device, comprising:

forming a semiconductor substrate that comprises at least first and second device regions, both of which have substantially planar upper surfaces oriented along one of a first set of equivalent crystal planes;

selectively masking the first device region;

growing a protruding semiconductor structure at the second device region, wherein the protruding semiconductor substrate has multiple intercepting surfaces that are oriented along a second, different set of equivalent crystal planes;

unmasking the first device region; and forming a first field effect transistor (FET) at the first device region and a second, complementary FET at the second device region, wherein the first FET comprises a channel that extends along the substantially planar upper surface of the first device region, and wherein the second, complementary FET comprises a channel that extends along the multiple intercepting upper surfaces of the protruding semiconductor structure at the second device region.

Preferably, a faceted epitaxial process is used to grow the protruding semiconductor structure. More preferably, the faceted epitaxial process is carried out at a growth temperature ranging from about 700° C. to about 900° C. and a growth pressure ranging from about 5 torr to about 80 torr.

In a still further aspect, the present invention relates to a semiconductor substrate comprising first and second device regions, wherein the first device region has a substantially planar surface oriented along one of a first set of equivalent crystal planes, and wherein the second device region comprises a protruding semiconductor structure having multiple intercepting surfaces oriented along a second different set of equivalent crystal planes.

Other aspects, features and advantages of the invention will be more fully apparent from the ensuing disclosure and appended claims.

DETAILED DESCRIPTION OF THE INVENTION, AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The term "substantially planar" as used herein refers to a surface that has protrusions or recesses of not more than 10 nm in height or depth.

Figure 2:
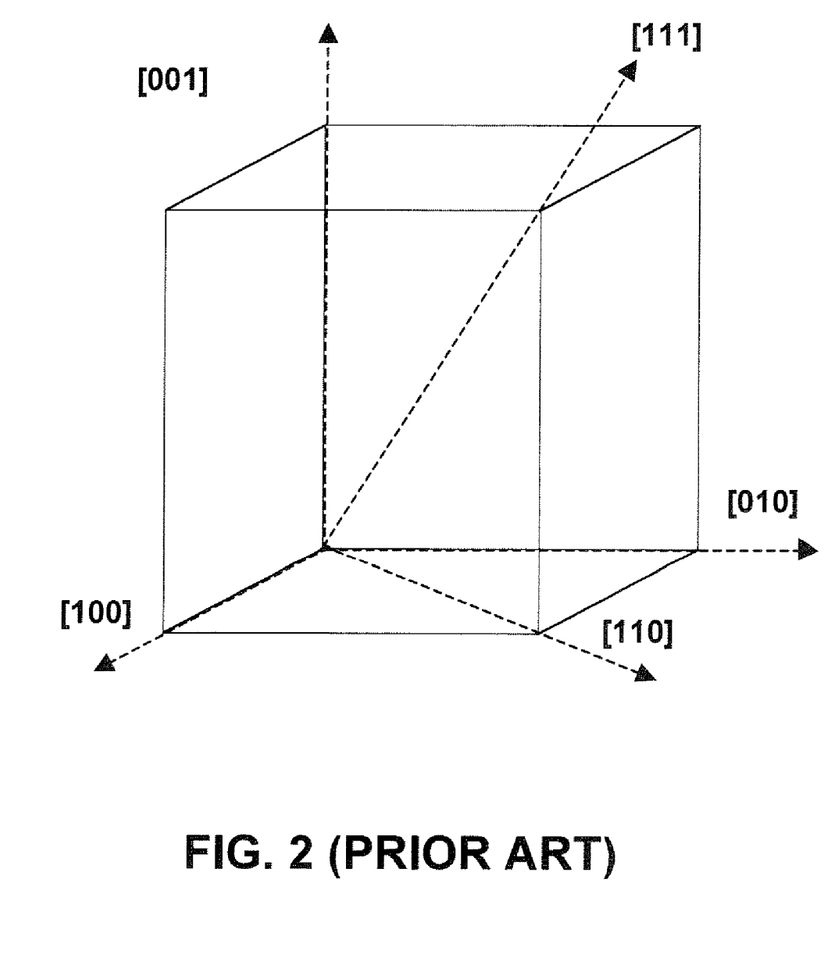
FIG. 2 shows a silicon crystal unit cell with certain crystal orientations specifically indicated by arrowheads.
Figure 3:
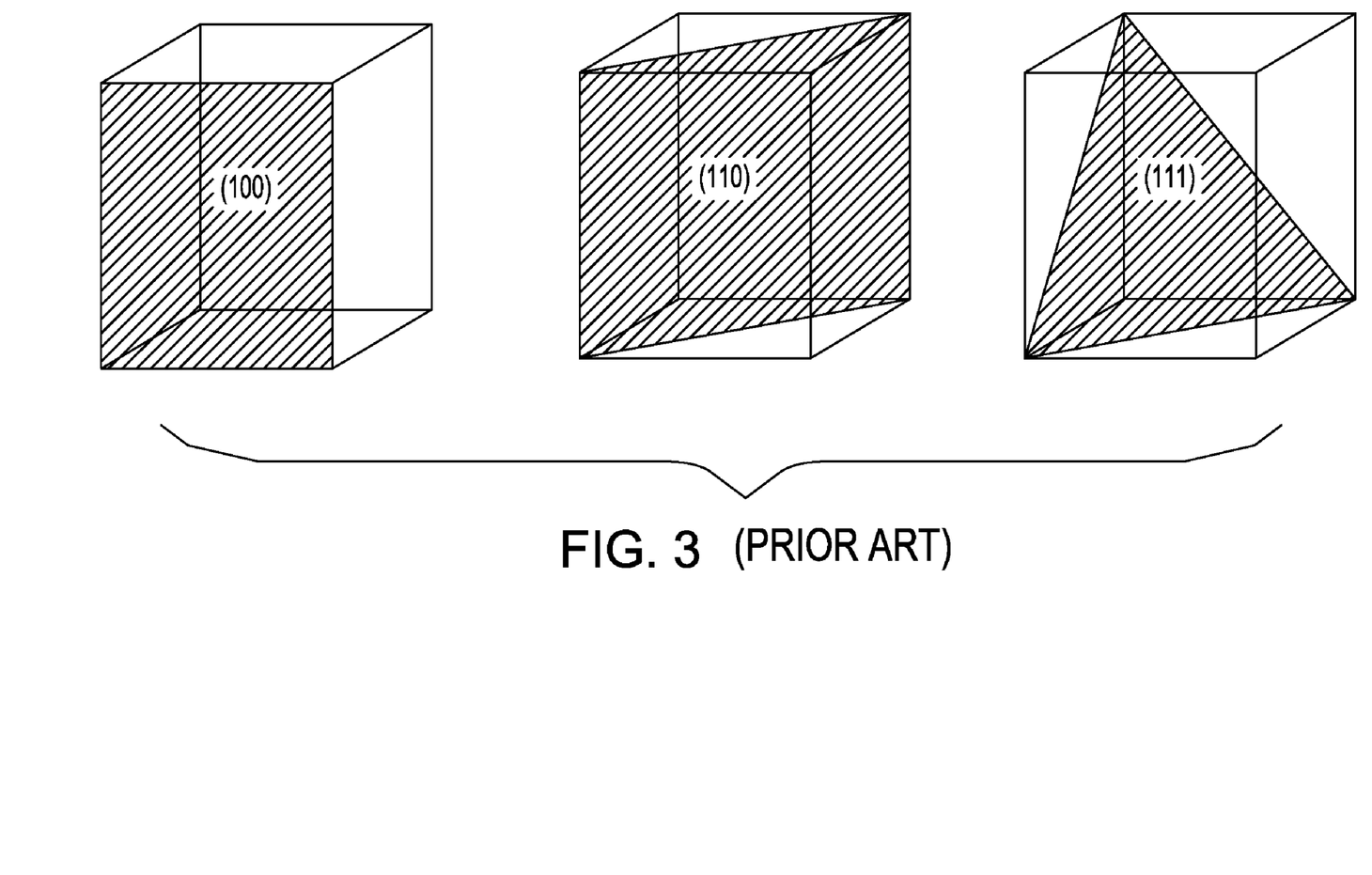
FIG. 3 shows certain specific crystal planes in silicon crystal unit cells.

In single crystal semiconductor materials, all lattice directions and lattice planes in a unit cell of a single crystal material can be described by a mathematical description known as a Miller Index. Specifically, the notation [hkl] in the Miller Index defines a crystal direction or orientation. FIG. 2 shows a single crystal silicon unit cell, which is a cubic cell. Certain crystal directions, such as [001], [100], [010], [110], and [111], are specifically indicated by arrowheads in the cubic unit cell. Moreover, the crystal planes or facets of a single crystal silicon unit cell are defined by the notation (hkl) in Miller Index, which refers to a particular crystal plane or facet that is perpendicular to the [hkl] direction. FIG. 3 illustratively shows the crystal planes (100), (110), and (111) of the single crystal silicon unit cells, which are respectively perpendicular to the [100], [110], and [111] directions. Further, because the unit cells are periodic in a semiconductor crystal, there exist families or sets of equivalent crystal directions and planes. The notation <hkl> in the Miller Index therefore defines a family or set of equivalent crystal directions or orientations. For example, the <100> directions include the equivalent crystal directions of [100], [010], and [001]; the <110> directions include the equivalent crystal directions of [110], [011], [101], [−1-10], [0-1-1], [−10-1], [−110], [0-11], [−101], [1-10], [01-1], and [10-1]; and the <111> directions include the equivalent crystal directions of [111], [−111], [1-11], and [11-1]. Similarly, the notation {hkl} defines a family or set of equivalent crystal planes or facets that are respectively perpendicular to the <hkl> directions. For example, the {100} planes include the set of equivalent crystal planes that are respectively perpendicular to the <100> directions.

The term "equivalent crystal planes" as used in the present invention therefore refers to a family of equivalent crystal planes or facets defined by the Miller Indexes, as described hereinabove.

The present invention provides semiconductor substrates with hybrid surface orientations. Specifically, each semiconductor substrate of the present invention contains a first device region with a substantially planar surface that is oriented along one of a first set of equivalent crystal planes. The semiconductor substrate further comprises a second device region that comprises a protruding (i.e., with respect to the substantially planar surface of the first device region) semiconductor structure with multiple intercepting surfaces that are oriented along a second, different set of equivalent crystal planes.

A CMOS device comprising complementary FETs can then be fabricated on the semiconductor substrate. Specifically, the complementary FETs have channel regions that are respectfully oriented along the first and second sets of equivalent crystal planes, which function to enhance respectful carrier mobility in the complementary FETs.

Figure 4:
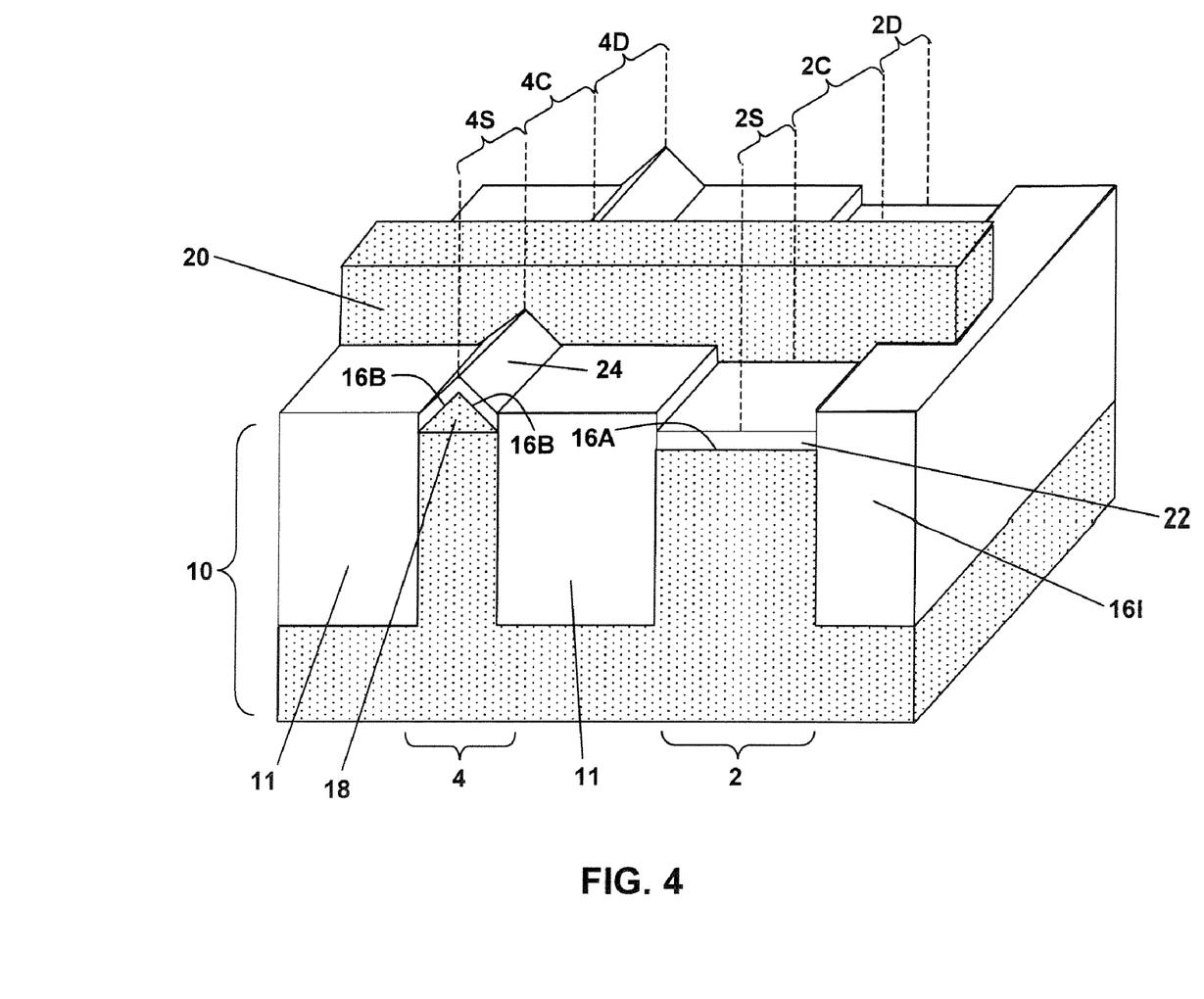
FIG. 4 is a three-dimensional view of a CMOS device fabricated on a semiconductor substrate that comprises an n-FET device region with a substantially planar upper surface oriented along one of the {100} planes of silicon, and a p-FET device region comprising a protruding semiconductor structure with multiple intercepting surfaces that are oriented along the {111} planes of silicon, according to one embodiment of the present invention.

FIG. 4 shows at least a partial three-dimensional view of a CMOS device, which is fabricated on a semiconductor substrate 10 that contains a first device region 2 and a second, complementary device region 4. In other words, one of the first and second device regions 2 and 4 is an n-FET device region, and the other is a p-FET device region.

The first and second device regions 2 and 4 are isolated from each other by isolation regions 11. The first device region 2 has a substantially planar surface 16A that is oriented along one of a first set of equivalent crystal planes, and the second device region 4 contains a protruding semiconductor structure 18 with multiple intercepting surfaces 16B oriented along a second, different set of equivalent crystal planes. More importantly, the first and second set of equivalent crystal planes are tilted or slanted with respect to each other, as shown in FIG. 4.

Gate dielectrics 22 and 24 are respectively formed over the first and second device regions 2 and 4. Further, a gate structure 20 is formed over both the first and second device regions 2 and 4 to define an a first FET that contains source, drain, and channel regions 2S, 2D, and 2C and a second, complementary FET that contains source, drain, and channel regions 4S, 4D, and 4C. The first channel 2C is located at the first device region 2 under the gate structure 20 and is oriented along the surface 16A (i.e., along the first set of equivalent crystal planes). The second channel 4C is located at the second device region 4 under the gate structure 20 and is oriented along the surfaces 16B (i.e., along the second, different set of equivalent crystal planes).

In this manner, the first and second, complementary FETs have hybrid channel orientations that are constructed and arranged for enhancing the respective carrier mobility in such FETs.

In one specific embodiment of the present invention, the first device region 2 is an n-FET device region, and it has a substantially planar upper surface 16A that is oriented along one of the {100} planes of silicon. The second, complementary device region 4 is correspondingly a p-FET device region, which comprises a protruding semiconductor structure 18 with multiple intercepting surfaces 16B oriented along the {111} planes of silicon.

In an alternative embodiment of the present invention, the substantially planar upper surface 16A of the n-FET device region 2 is oriented along one of the {110} planes of silicon. The p-FET device region 4 comprises a protruding semiconductor structure 18 with multiple intercepting surfaces 16B, which are oriented along the {111} planes of silicon, as shown in FIG. 4

FIGS. 5-9 are cross-sectional views along the gate structure 20, which illustrate exemplary processing steps that can be used for fabricating the CMOS device of FIG. 4 using a facet epitaxy process, according to one embodiment of the present invention.

Figure 5:
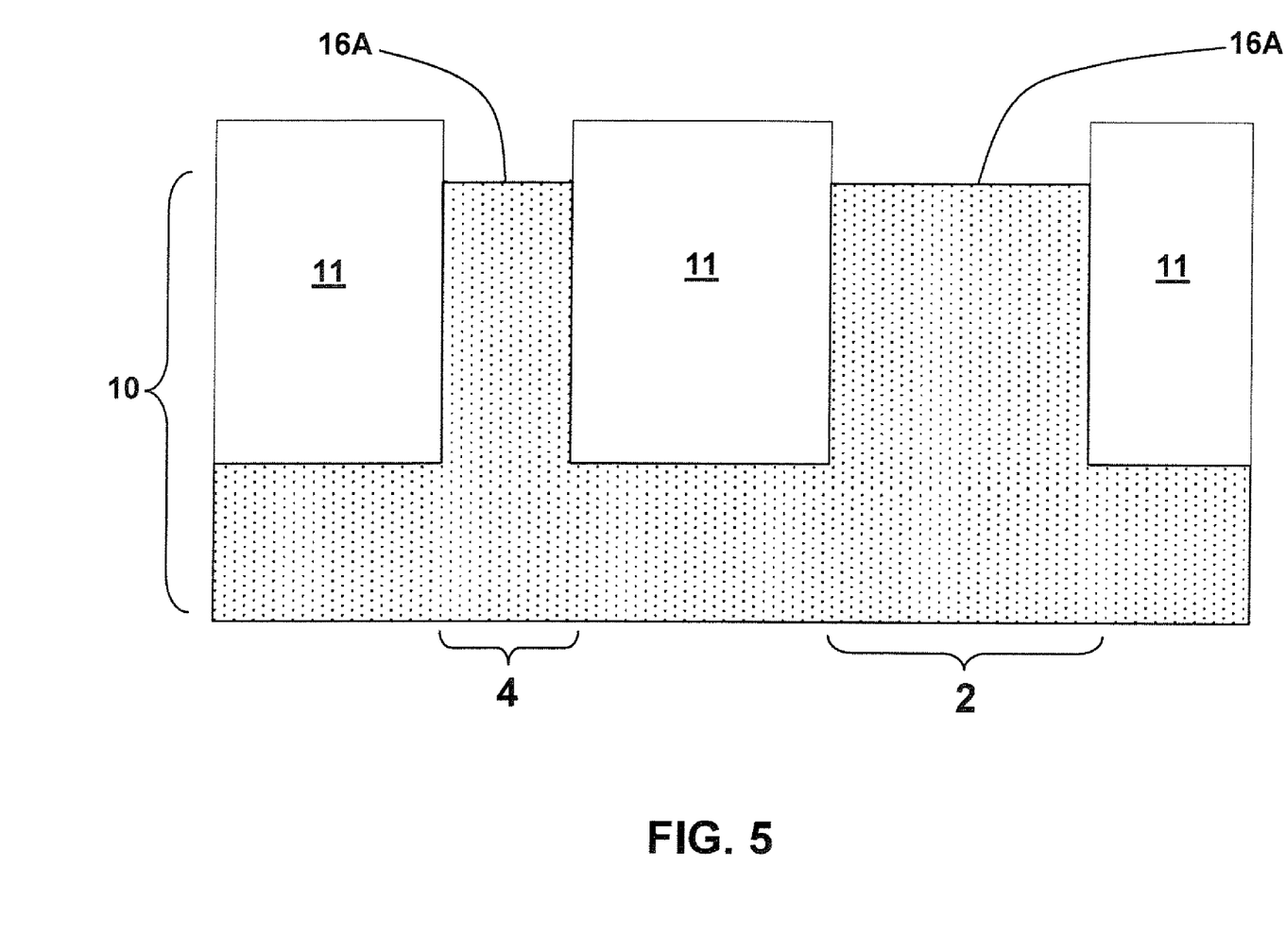
FIGS. 5-9 illustrate exemplary processing steps used for fabricating the CMOS device of FIG. 4 using a facet epitaxy process, according to one embodiment of the present invention.

Reference is first made to FIG. 5, which shows formation of isolation regions 11 in a semiconductor substrate 10 to define a first device region 2 and a second, complementary device region 4. The semiconductor substrate 10 has a substantially planar upper surface 16A that is exposed at both the first and the second device regions 2 and 4. The surface 16A is preferably oriented along a first set of equivalent crystal planes.

The semiconductor substrate 10 may comprise any semiconductor material, which includes, but is not limited to: Si, SiGe, graded SiGe, Ge, Ge alloys, Si:C, SiGe:C, GaAs, InAs, InP, as well as other III-V or II-VI compound semiconductors. The semiconductor substrate 10 may also comprise an organic semiconductor or a layered semiconductor such as Si/SiGe, a silicon-on-insulator (SOI) or a SiGe-on-insulator (SGOI). Preferably, the semiconductor substrate 10 is composed of a Si-containing semiconductor material, i.e., a semiconductor material that includes silicon. In the specific embodiment as shown in FIG. 5, the semiconductor substrate 10 consists essentially of bulk single crystal silicon. Alternatively, the semiconductor substrate 10 may has semiconductor-on-silicon configuration and may comprise, from bottom to top, a base semiconductor substrate layer (not shown), a buried insulator layer (not shown), and a semiconductor device layer (not shown). The semiconductor substrate 10 may be doped, undoped or contain both doped and undoped regions (not shown) therein.

When the semiconductor substrate 10 comprises single crystal silicon, the upper surface 16 is preferably oriented along one of the {100} or the {110} planes of silicon.

The isolation regions 11 are provided in the semiconductor substrate 10 to separate the first and second device regions 2 and 4 from each other. The isolation regions 11 may be either trench isolation regions or field oxide isolation regions. Trench isolation regions can be readily formed utilizing a conventional trench isolation process well known to those skilled in the art. For example, lithography, etching and filling of the trench with a trench dielectric may be used in forming the trench isolation regions. Optionally, a liner may be formed in the trench prior to trench fill, a densification step may be performed after the trench fill and a planarization process may follow the trench fill as well. Field oxide isolation regions may be formed utilizing a so-called local oxidation of silicon process.

Figure 6:
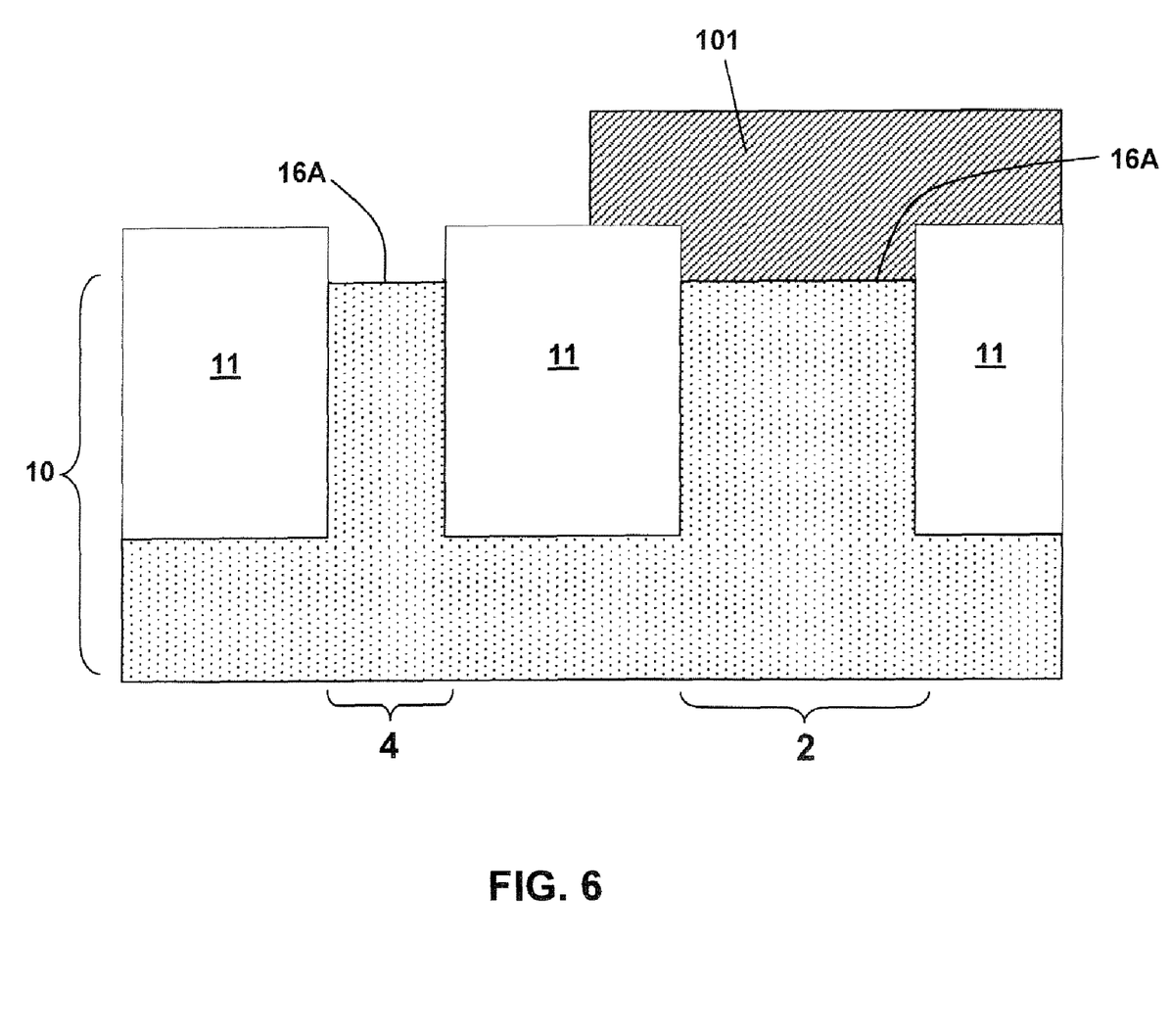

Next, a block mask 101 is selectively formed over the first device region 2, while the second device region 4 is exposed, as shown in FIG. 6. The block mask can be readily formed via conventional lithography and etching.

Figure 7:
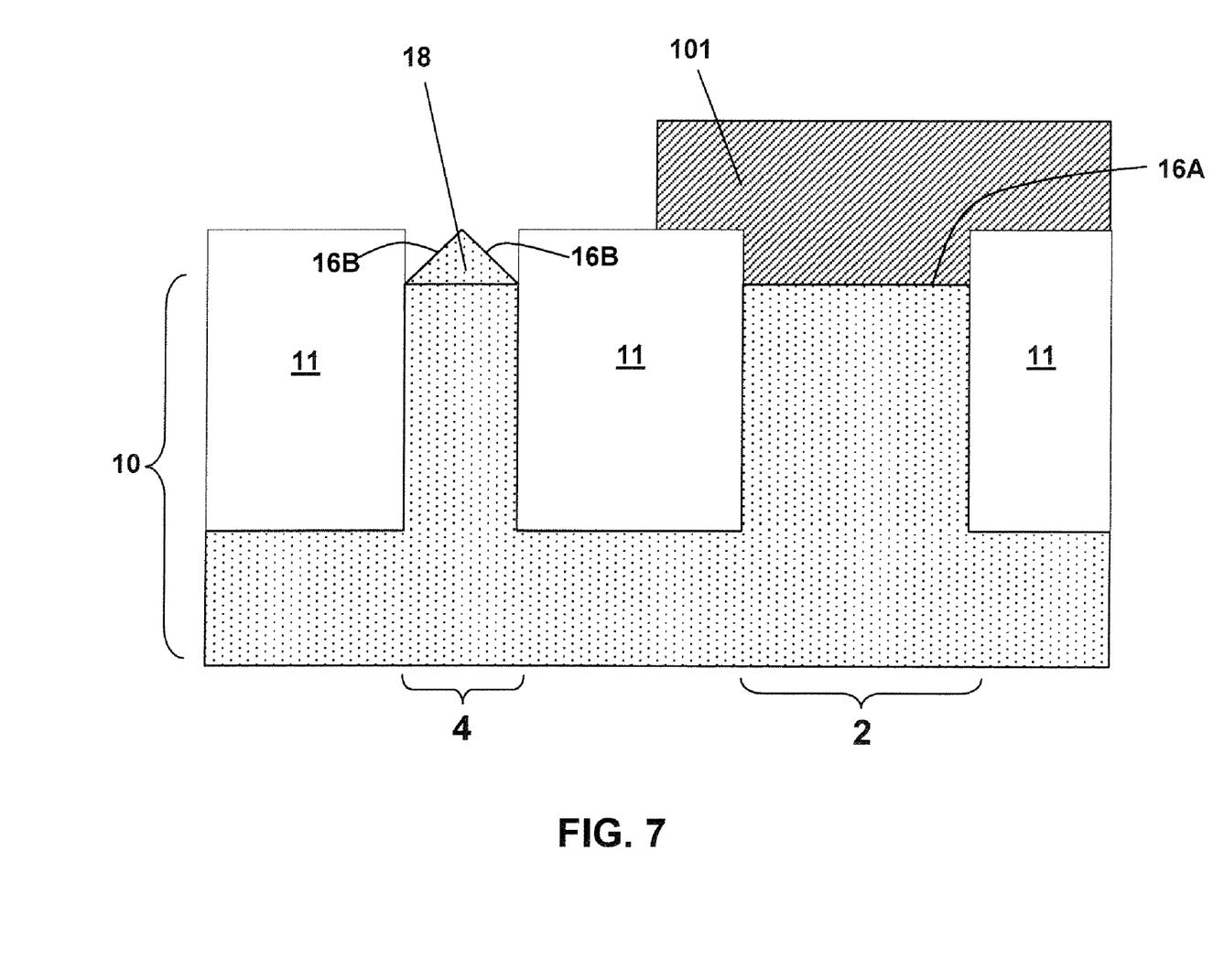

A selective epitaxy process is then carried out to form a protruding semiconductor structure 18 at the second device region 4, as shown in FIG. 7. The protruding semiconductor structure 18 has multiple intercepting surfaces 16B that are oriented along a second set of equivalent crystal planes that is different from and is slanted with respect to the first set of equivalent crystal planes, along which the substrate surface 16A is oriented.

Selective epitaxial growth of semiconductor materials has been conventional used to form isolated semiconductor device regions. For example, openings are first provided through an oxide layer that is located over a semiconductor substrate to expose the underlying semiconductor substrate. The substrate is then placed in a reactor for selective epitaxial growth of a semiconductor material (such as Si, SiGe, or Si:C) through the openings to form isolated semiconductor device regions on the oxide layer. Significant faceting effect, which refers to the formation of another growth plane that is slanted from the major growth plane (as defined by the substrate surface), has been observed when the selective epitaxial growth proceeds beyond a certain layer thickness. The new growth plane, i.e., the facet, is oriented along a different crystallographic plane than that of the major growth plane.

Such faceting effect has been considered in the past as an undesirable side effect of the selective epitaxial growth process, and various modifications or optimizations have been made to the selective epitaxial growth process in order to suppress and minimize such faceting effect.

However, the inventors of the present invention have discovered that the faceting effect of the selective epitaxial growth process can be used advantageously to form a semiconductor with hybrid surface orientations. Specifically, the faceting effect, when enhanced, results in a protruding semiconductor structure with upper surfaces that are oriented along a new set of crystallographic planes that are slanted from the major growth plane defined by the substrate surface. In other words, the facets of the protruding semiconductor structure eventually intercept with one another, and the original growth plane completely disappears on the protruding semiconductor structure. The selective epitaxial growth process in which the faceting effect is enhanced so as to form the protruding semiconductor structure as described hereinabove is referred to hereinafter as the faceted epitaxy.

Consequently, a semiconductor substrate with hybrid surface orientations is formed, while the regions where no faceted epitaxy is carried out maintain their original surface orientations, and the regions on which protruding semiconductor structures have been formed by the faceted epitaxy are imparted with new, different surface orientations.

Because the faceting effect is a result of differential semiconductor growth along different crystallographic planes, the faceted epitaxial growth eventually terminates at the set of crystal planes with the slowest growth rate, and the resulting semiconductor structures therefore have surfaces oriented such crystal planes with slowest semiconductor growth rate. Various processing parameters, including the growth temperature, the growth pressure, the flow rates of the processing gases, etc., can be readily adjusted to modulate the relative growth rates along different sets of crystal planes and thereby control the surface orientations of the resulting semiconductor structures.

When protruding semiconductor structures comprising silicon, silicon germanium, carbon-doped silicon, or other silicon-containing semiconductor materials are grown by the faceted epitaxy of the present invention, the faceted epitaxy process is preferably conducted at a growth temperature of from about a growth temperature ranging from about 700° C. to about 900° C. and a growth pressure ranging from about 5 torr to about 80 torr. Under such processing conditions, the growth rate along the $\{111\}$ planes of silicon is the smallest among all crystal planes of silicon, so the protruding semiconductor structures so formed will have surfaces oriented along the $\{111\}$ planes of silicon. Alternatively, the processing conditions can be adjusted so as to form protruding semiconductor structures with surfaces oriented along other planes of silicon.

The protruding semiconductor structure 18 may comprise any suitable semiconductor materials selected from: Si, SiGe, graded SiGe, Ge, Ge alloys, Si:C, SiGe:C, GaAs, InAs, InP, as well as other III-V or II-VI compound semiconductors. Preferably, the protruding semiconductor structure 18 is composed of Si, SiGe, graded SiGe, Ge, Si:C, or SiGe:C. Same or different semiconductor materials can be used for forming the semiconductor substrate 10 and the protruding semiconductor structure 18. In a specific embodiment of the present invention, the semiconductor substrate 10 comprises single crystal silicon, and the protruding semiconductor structure 18 comprises epitaxially grown silicon or pseudomorphically grown SiGe (either with a flat Ge content or a graded Ge content).

After formation of the protruding semiconductor structure 18 at the second device region 4, the block mask 101 is removed, and conventional dopant implantation steps can then be carried out to form well implants and/or extension/halo implants (not shown) in the first and second device regions 2 and 4.

Figure 8:
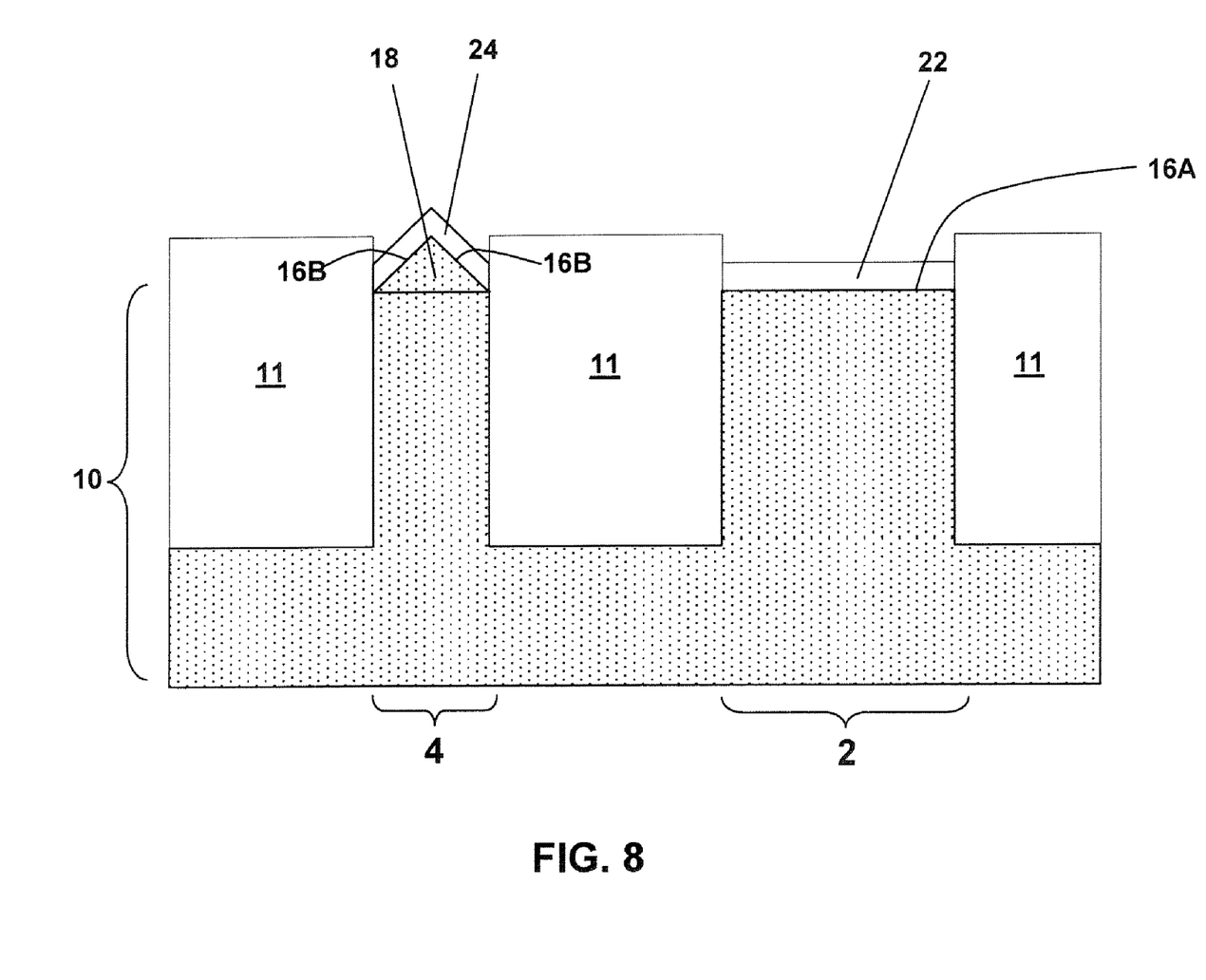

Subsequently, gate dielectric 22 and 24 are formed over the upper surfaces 16A and 16B of the first and second device regions 2 and 4, respectively, as shown in FIG. 8.

The gate dielectric layers 22 and 24 of the present invention may be comprised of any suitable dielectric material, including, but not limited to: oxides, nitrides, oxynitrides and/or silicates (including metal silicates and nitrided metal silicates). In one embodiment, it is preferred that the gate dielectric layers 22 and 24 are comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The physical thickness of the gate dielectric layers 22 and 24 may vary widely, depending on the specific deposition technique employed. Typically, the gate dielectric layers 22 and 24 each has a thickness from about 0.5 to about 10 nm, with a thickness from about 1 to about 5 nm being more typical. The gate dielectric layers 22 and 24 can be formed by a thermal growing process such as, for example, oxidation, nitridation or oxynitridation. Alternatively, the gate dielectric layers 22 and 24 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric layers 22 and 24 may also be formed utilizing any combination of the above processes.

In a preferred, but not necessary embodiment of the present invention, a sacrificial oxide layer (not shown) is formed over the first and second device regions 2 and 4 before the dopant implantation step. Such a sacrificial oxide layer (not shown)

is removed after the dopant implantation step by oxide stripping, followed by formation of the gate dielectric layers 22 and 24. The sacrificial oxide layer functions to moderate the sharpness of the peak formed in the protruding semiconductor structure 18 by the faceted epitaxy.

Figure 9:
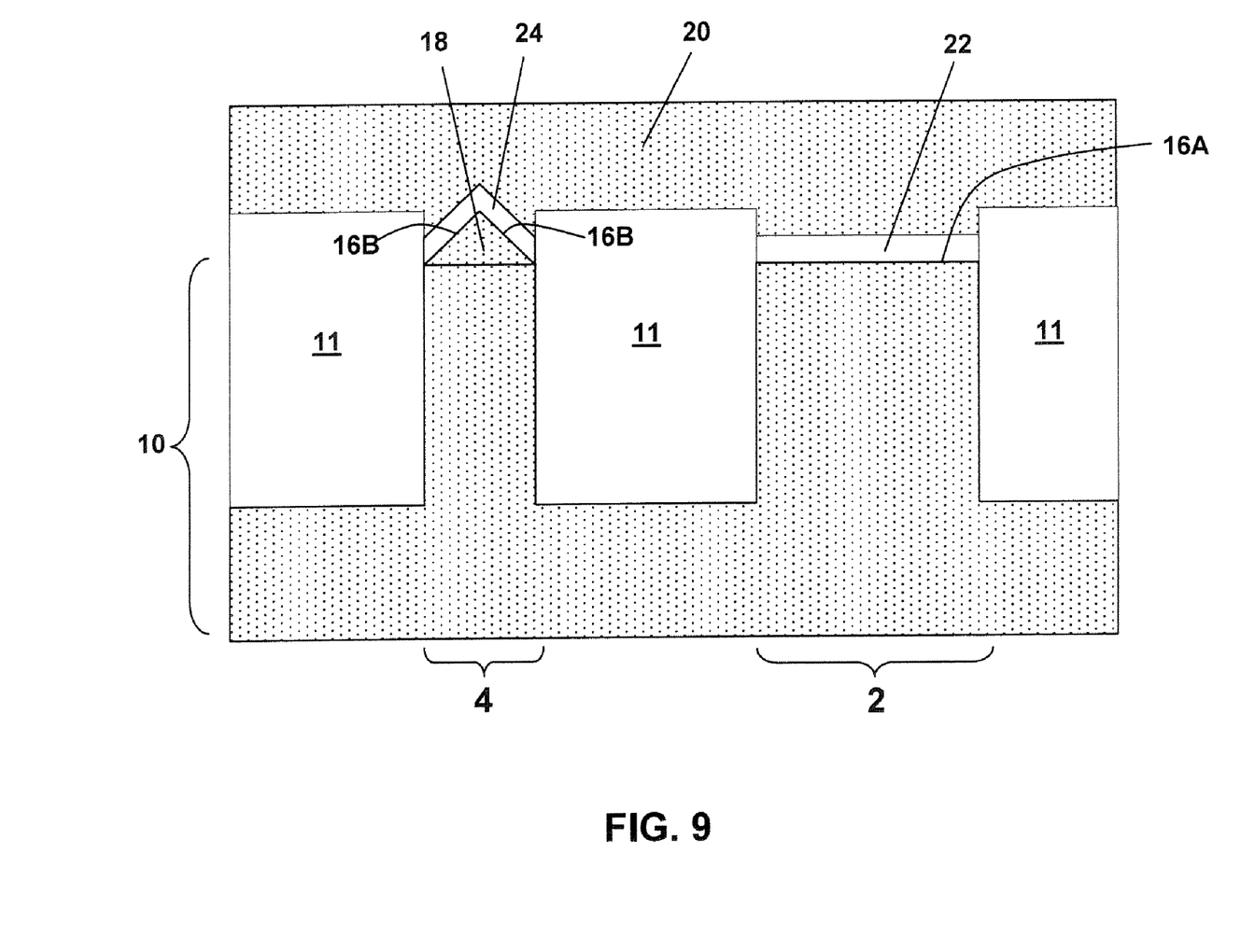

Subsequently, a patterned gate conductor 20 is formed over both the first and second device regions 2 and 4 atop the gate dielectric layers 22 and 24 and the isolation regions 11, as shown in FIG. 9. The patterned gate conductor 20 specifically defines the source, drain and channel regions 2S, 2D, 2C, 4S, 4D, and 4C for the FETs located at the first and second device regions 2 and 4, as shown in FIG. 4.

The pattern gate conductor 20 can be readily formed by first depositing a blanket gate conductor layer (not shown), followed by patterning the blanket gate conductor layer (not shown) using conventional lithography and etching. The lithographic step, preferably inverse gate level (PC) lithography, includes applying a photoresist (not shown) to the upper surface of the blanket gate conductor layer (not shown), exposing the photoresist (not shown) to a desired pattern of radiation and developing the exposed photoresist (not shown) utilizing a conventional resist developer. The pattern in the photoresist (not shown) is then transferred to the underneath gate conductor layer (not shown) utilizing one or more dry etching steps. Suitable dry etching processes that can be used in the present invention include, but are not limited to: reactive ion etching (RIE), ion beam etching, plasma etching or laser ablation. Preferably, but not necessarily, the patterned gate conductor 20 comprises polycrystalline silicon (poly-Si). The etching step preferably is carried out by silicon-selective RIE techniques. The patterned photoresist (not shown) is then removed by resist stripping after etching has been completed.

As mentioned hereinabove, the channel region 2C of the first FET located at the first device region 2 has a channel orientation that is defined by the substantially planar upper surface 16A at the first device region 2. The channel region 4C of the second, complementary FET located at the second device region 4 has a different channel orientation, which is defined by the surfaces 16B of the protruding semiconductor structure 18 at the second device region 4.

Subsequently, conventional CMOS processing steps, which are not described herein in detail, can be carried out to form a complete CMOS device containing complementary FETs.

Note that while FIGS. 4-9 illustratively demonstrate an exemplary CMOS device structure and exemplary processing steps according to specific embodiments of the present invention, it is clear that a person ordinarily skilled in the art can readily modify the device structure and processing steps for adaptation to specific application requirements, consistent with the above descriptions. For example, while the semiconductor substrates as shown in FIGS. 4-9 represent bulk semiconductor substrates, it should be appreciated that semiconductor-on-insulator (SOI) substrates can also be used for practice of the present application. Further, while the crystal planes of single crystal silicon are primarily illustrated by FIGS. 4-9 for defining the substrate surface orientations, other single crystal semiconductor substrate materials with non-cubic unit cells, such as single crystal gallium nitride having hexagonal unit cells, can also be used for fabricating the CMOS devices of the present invention, as long as such other single crystal semiconductor materials contain different sets of equivalent crystal planes that have different epitaxial growth rates and different carrier mobility values. A person ordinarily skilled in the art can readily modify the device structure and processing steps illustrated in FIGS. 4-9 for adaptation to other substrate structures, crystal orientations, or semiconductor materials, consistent with the spirit and principles of the present invention.

It is noted that the drawings of the present invention are provided for illustrative purposes and are not drawn to scale.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A method for forming a semiconductor device, comprising:
    forming a semiconductor substrate that comprises at least first and second device regions, both of which have substantially planar upper surfaces oriented along one of a first set of equivalent crystal planes;
    selectively masking the first device region;
    growing a protruding semiconductor structure at the second device region, wherein the protruding semiconductor structure has two surfaces intercepting at an apex, the two surfaces oriented along a second, different set of equivalent crystal planes, the protruding semiconductor structure grown with a faceted epitaxial process at a growth temperature ranging from 700° C. to 900° C. and a growth pressure ranging from 5 torr to 80 torr;
    unmasking the first device region; and
    forming a first field effect transistor (FET) at the first device region and a second, complementary FET at the second device region, wherein the first FET comprises a channel that extends along the substantially planar upper surface of the first device region, and wherein the second, complementary FET comprises a channel that extends along the two surfaces of the protruding semiconductor structure at the second device region.

2. The method of claim 1, wherein the semiconductor substrate and the protruding semiconductor structure comprise semiconductor materials independently selected from the group consisting of Si, SiGe, graded SiGe, Ge, Ge alloys, Si:C, SiGe:C, GaAs, InAs, InP, and III-V and II-VI compound semiconductors.

3. The method of claim 1, wherein the semiconductor substrate comprises single crystal silicon, and wherein the first and second sets of equivalent crystal planes are selected from the group consisting of the {100}, {110}, and {111} planes of silicon.

4. The method of claim 3, wherein the first set of equivalent crystal planes are the {100} planes of silicon, the second, different set of equivalent crystal planes are the {111} planes of silicon, the first FET is an n-channel FET, and the second, complementary FET is a p-channel FET.

5. The method of claim 3, wherein the first set of equivalent crystal planes are the {110} planes of silicon, the second, different set of equivalent crystal planes are the {111} planes of silicon, the first FET is a p-channel FET, and the second, complementary FET is an n-channel FET.

6. The method of claim 1, comprising forming a static random access memory (SRAM) cell, wherein said SRAM cell comprises at least one pull-down FET located at one of the first and second device regions and at least one pull-up FET located at the other of the first and second device regions.

7. The method of claim 1, wherein the semiconductor substrate comprises a bulk semiconductor structure.

8. The method of claim 1, wherein the semiconductor substrate has a semiconductor-on-insulator configuration and comprises, from bottom to top, a base semiconductor substrate layer, a buried insulator layer, and a semiconductor device layer.

9. The method of claim 1, wherein a static random access memory (SRAM) cell is provided comprising at least one pull-down n-channel FET located at one of the first and second device regions and at least one pull-up p-channel FET located at the other of the first and second device regions.

10. A method for forming a semiconductor device, comprising:

forming a semiconductor substrate that comprises at least first and second device regions, both of which have substantially planar upper surfaces oriented along one of a first set of equivalent crystal planes;

selectively masking the first device region;

growing a protruding semiconductor structure at the second device region, wherein the protruding semiconductor substrate has multiple intercepting surfaces that are oriented along a second, different set of equivalent crystal planes;

unmasking the first device region; and forming a static random access memory (SRAM) cell including a first field effect transistor (FET) at the first device region and a second, complementary FET at the second device region, wherein the first FET comprises a channel that extends along the substantially planar upper surface of the first device region, and wherein the second, complementary FET comprises a channel that extends along the multiple intercepting upper surfaces of the protruding semiconductor structure at the second device region, wherein said SRAM cell comprises at least one pull-down FET located at one of the first and second device regions and at least one pull-up FET located at the other of the first and second device regions.

11. The method of claim 10, wherein the protruding semiconductor structure is grown by a faceted epitaxial process.

12. The method of claim 11, wherein the faceted epitaxial process is carried out at a growth temperature ranging from about 700° C. to about 900° C. and a growth pressure ranging from about 5 torr to about 80 torr.

13. The method of claim 10, wherein the semiconductor substrate and the protruding semiconductor structure comprise semiconductor materials independently selected from the group consisting of Si, SiGe, graded SiGe, Ge, Ge alloys, Si:C, SiGe:C, GaAs, InAs, InP, and III-V and II-VI compound semiconductors.

14. The method of claim 10, wherein the semiconductor substrate comprises single crystal silicon, and wherein the first and second sets of equivalent crystal planes are selected from the group consisting of the {100}, {110}, and {111} planes of silicon.

15. The method of claim 14, wherein the first set of equivalent crystal planes are the {100} planes of silicon, the second, different set of equivalent crystal planes are the {111} planes of silicon, the first FET is an n-channel FET, and the second, complementary FET is a p-channel FET.

16. The method of claim 14, wherein the first set of equivalent crystal planes are the {110} planes of silicon, the second, different set of equivalent crystal planes are the {111} planes of silicon, the first FET is a p-channel FET, and the second, complementary FET is an n-channel FET.

17. The method of claim 10, wherein the semiconductor substrate comprises a bulk semiconductor structure.

18. The method of claim 10, wherein the semiconductor substrate has a semiconductor-on-insulator configuration and comprises, from bottom to top, a base semiconductor substrate layer, a buried insulator layer, and a semiconductor device layer.

* * * * *